United States Patent [19]

Sakai et al.

[11] 4,074,325
[45] Feb. 14, 1978

[54] SYSTEM FOR SENSING THE PEAKS OF AN OUTPUT FROM A MAGNETIC HEAD

[75] Inventors: Yoshiaki Sakai; Kuniki Murayama, both of Musashino, Japan

[73] Assignee: Teac Corporation, Tokyo, Japan

[21] Appl. No.: 770,785

[22] Filed: Feb. 22, 1977

[51] Int. Cl.² .................... G11B 5/09; G11B 5/02
[52] U.S. Cl. ................................ 360/39; 360/24
[58] Field of Search ............... 360/39, 66, 46, 40, 360/41, 42, 43, 24

[56] References Cited

U.S. PATENT DOCUMENTS

| 2,864,077 | 12/1958 | DeFurk | 360/40 |
| 3,478,255 | 11/1969 | Parker et al. | 360/40 |
| 3,581,297 | 5/1971 | Behr et al. | 360/40 |
| 3,715,738 | 2/1973 | Kleist et al. | 360/40 |

Primary Examiner—Vincent P. Canney
Attorney, Agent, or Firm—Woodcock, Washburn, Kurtz & Mackiewicz

[57] ABSTRACT

For sensing the peaks of an electric signal reconverted by a magnetic head from a digital signal stored on a magnetic tape or other recording media, a half-wave rectifying diode is connected to the magnetic head via an amplifier. The output of the half-wave rectifying diode is connected directly to a resistance-capacitance differentiating circuit, without interposition of a slicer therebetween. An output from the differentiating circuit is compared with a variable level-setting reference voltage in a substantially connected comparator circuit, and the latter produces output pulses the trailing edges of which substantially correspond in time to the peaks of the output from the magnetic head. A pulse trailing edge sensing circuit connected next to the comparator circuit produces output pulses of comparatively short durations corresponding to the trailing edges of the comparator output pulses. The comparator circuit has a switching transistor for selectively varying a differential between the levels of its reference voltage in accordance with the output amplitude of the differentiating circuit.

6 Claims, 8 Drawing Figures

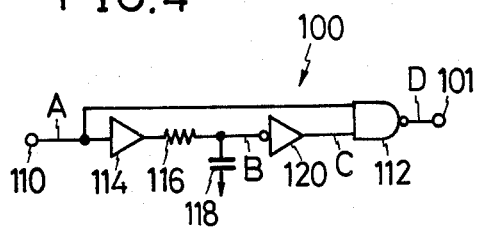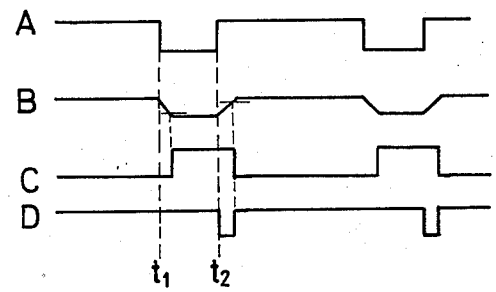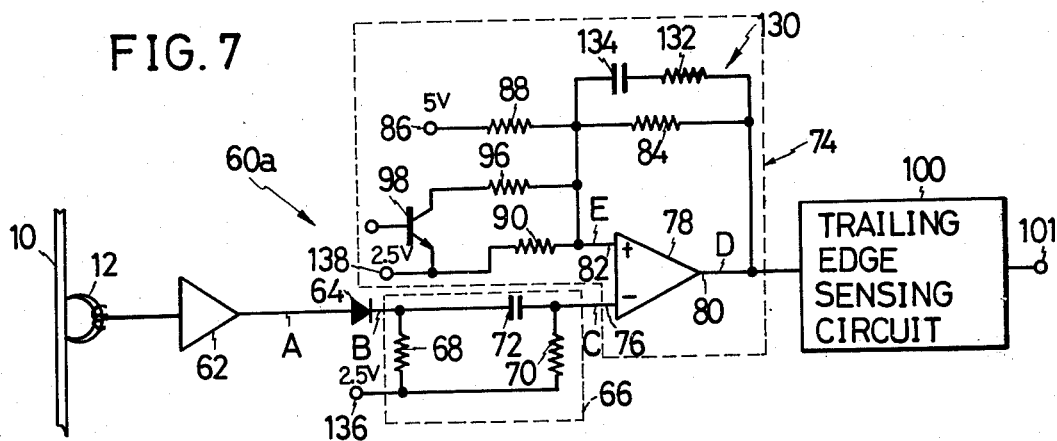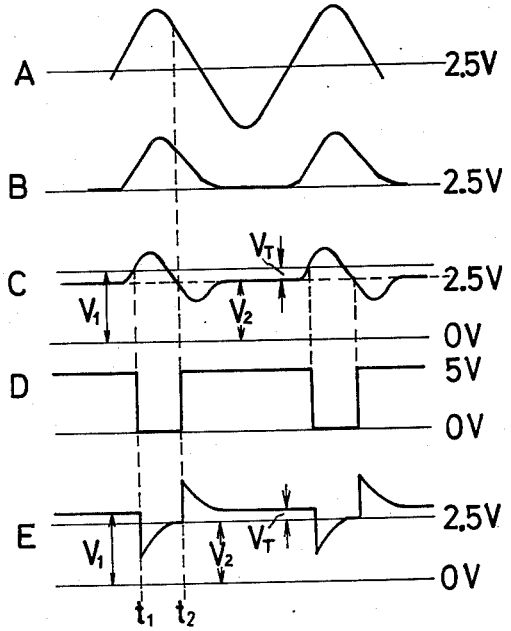

SYSTEM FOR SENSING THE PEAKS OF AN OUTPUT FROM A MAGNETIC HEAD

BACKGROUND OF THE INVENTION

1. Field of the Invention

Our invention relates to a system for sensing or locating the peaks of an output produced by a magnetic head as same reads digital or other information stored on a magnetic recording medium such as tape. More specifically, our invention is directed to improvements in such a system intended to enhance the accuracy with which the peaks of a magnetic head output are sensed or located.

2. Description of the Prior Art

A peak sensing system has been suggested which comprises an amplifier connected to a magnetic head, a half-wave rectifier, a slicer circuit, a differentiating circuit, a comparator circuit, and a pulse trailing edge sensing circuit (shown in FIG. 1 of the accompanying drawings). The slicer circuit (known also as an amplitude gate) interposed between half-wave rectifier and differentiating circuit of this prior art system is intended to block the passage therethrough of noise which may be contained in the output from the magnetic head.

Since, however, the slicer circuit permits the passage therethrough of only those portions of the amplified and half-wave rectified output from the magnetic head which lie above a relatively high boundary amplitude level, the amplitude of the output from the subsequently connected differentiating circuit becomes so small that the differential between the upper and the lower levels or "trip points" of the reference voltage of the comparator circuit must be minimized.

Thus, in event the output from the differentiating circuit has some high frequency noise superposed thereon, the comparator circuit is highly likely to respond unnecessarily to such noise, producing a rapid succession of output pulses. These undesired comparator output pulses cause the subsequent pulse trailing edge sensing circuit to produce corresponding output pulses out of agreement with the peaks of the output from the magnetic head.

SUMMARY OF THE INVENTION

It is an object of our invention to provide an improved system for accurately sensing or locating the peaks of an output from a magnetic head.

Another object of our invention is to provide a peak sensing system which dispenses with a slicer but which makes no unnecessary response to noise that may be contained in an output from a magnetic head.

A further object of our invention is to provide a peak sensing system which is capable of ascertaining the peaks of a magnetic head output after the magnetization level of desired information on a magnetic recording medium has lessened with the lapse of time or for other reasons, substantially as accurately as immediately after the information has been recorded thereon.

A still further object of our invention is to provide a peak sensing sytem which is readily adaptable for sensing positive and/or negative peaks of an output from a magnetic head.

Briefly, the peak sensing system in accordance with our invention comprises half-wave rectifier means connected to a magnetic head via amplifier means for effecting half-wave rectification of the amplified output from the magnetic head, and differentiating circuit means connected directly to the half-wave rectifier means for "differentiating" the output therefrom. Connected to the differentiating circuit means is comparator means for comparing the output therefrom with a level-setting reference voltage. This reference voltage has first and second levels with a sufficiently great differential therebetween to prevent the comparator means from responding to noise that may be contained in the output from the differentiating circuit means. The system further comprises means connected to the comparator means for producing output pulses which correspond in time to the trailing edges of output pulses from the comparator means and hence to the peaks of the output from the magnetic head.

According to a further feature of our invention, the reference voltage level differential (i.e., hysteresis) of the comparator means is made selectively variable to either of two predetermined values, in view of the fact digital or like signals stored on magnetic recording media inevitably suffer a decrease in their magnetization level wtih the lapse of time or for other reasons. Thus, when the system according to our invention is employed for monitoring a signal substantially concurrently as same is recorded on a magnetic recording medium, for example, the reference voltage level differential may be set at a higher value ranging from about 30 to about 50 percent, preferably about 40 percent, of the amplitude of the output from the differentiating circuit means.

For signal reading operation after the magnetization level of the recorded signal has lessened, the reference voltage level differential may be set at a lower value ranging from about 5 to about 25 percent, preferably about 15 percent, of the normal amplitude of the output from the differentiating circuit means. By the term "normal output amplitude" as used herein and in the claims appended hereto is meant the amplitude of the output which will be produced by the differentiating circuit means if a signal on a magnetic recording medium is read or monitored immediately after, or substantially concurrently as, it is recorded thereon.

It should be appreciated that such great differentials between the reference voltage levels, which are essential to make the comparator means unresponsive to noise that may be contained in the output from the magnetic head, are made possible by the absence of a slicer from between half-wave rectifier means and differentiating circuit means of the peak sensing system in accordance with our invention. In other words, since the amplified and half-wave rectified output from the magnetic head is supplied directly to the differentiating circuit means according to our invention, the output from the latter has a significantly greater amplitude than in the case where a slicer is provided, so that the reference voltage level differentials can be correspondingly increased.

The above and other objects, features and advantages of our invention and the manner of attaining them will become more apparent, and the invention itself will best be understood, from the following detailed description which is to be read in connection with the accompanying drawings showing some exemplary embodiments of our invention.

BRIEF DESCRIPTION OF THE DRAWINGS

FIG. 4 is a schematic electrical diagram showing one possible configuration of the pulse trailing edge sensing circuit used in the peak sensing system of FIG. 3;

FIG. 5 is a representation of waveforms useful in explaining the operation of the pulse trailing edge sensing circuit of FIG. 4;

FIG. 7 is a schematic electrical diagram of a modified example of the peak sensing system of FIG. 3; and FIG. 8, consisting of 8A through 8E, is a representation of waveforms useful in explaining the operation of the modified peak sensing system of FIG. 7.

DETAILED DESCRIPTION

Figure 1:
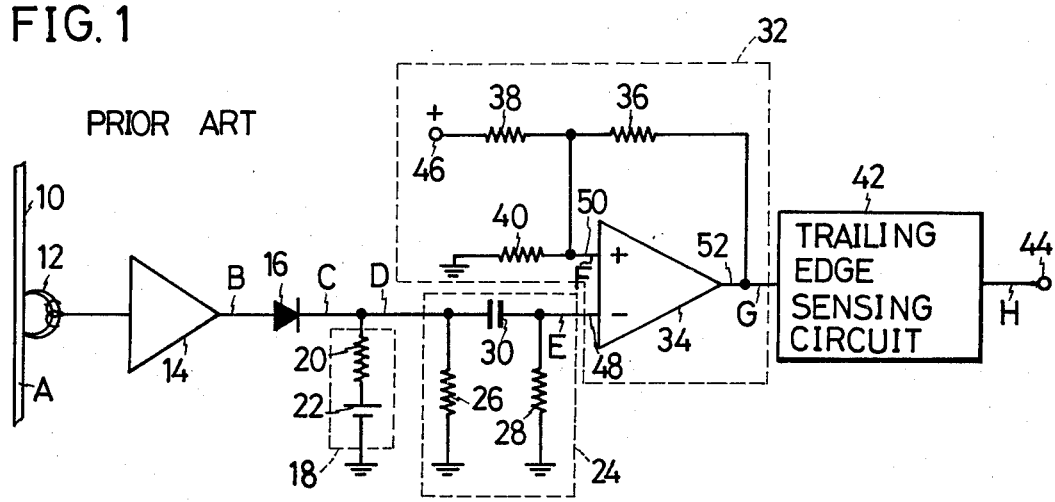
FIG. 1 is a schematic electrical diagram of a prior art peak sensing system having particular revelance to our invention.

Prior to the description of some exemplary embodiments of our invention, it is considered essential that the prior art peak sensing system be shown and described in some more detail, the better to make clear the features and advantages of the invention. With reference to FIG. 1, there is shown at 10 a magnetic tape on which there is stored a digital signal in the form of magnetic variations. A magnetic head 12 converts the magnetic variations of the tape into corresponding electric energy in the well known manner.

The prior art peak sensing system comprises an amplifier 14 for amplifying an output from the magnetic head 12, a diode 16 for half-wave rectification of the amplified output from the magnetic head, a slicer circuit 18 including resistor 20 and power supply 22 for permitting the passage therethrough of only those portions of the half-wave rectified output which lie above a predetermined boundary amplitude level, a differentiating circuit 24 including resistors 26 and 28 and capacitor 30 for "differentiating" the output from the slicer circuit, a comparator circuit 32 including operational amplifier 34 and resistors 36, 38 and 40 for comparing the output from the differentiating circuit with a variable level-setting reference voltage, and a pulse trailing edge sensing circuit 42 which produces output pulses of comparatively short durations corresponding in time to the trailing edges of output pulses from the comparator circuit. The prior art peak sensing system further comprises an output terminal 44 connected to the pulse trailing edge sensing circuit 42, and a positive biasing terminal 46 connected to the comparator circuit 32.

Figure 2:
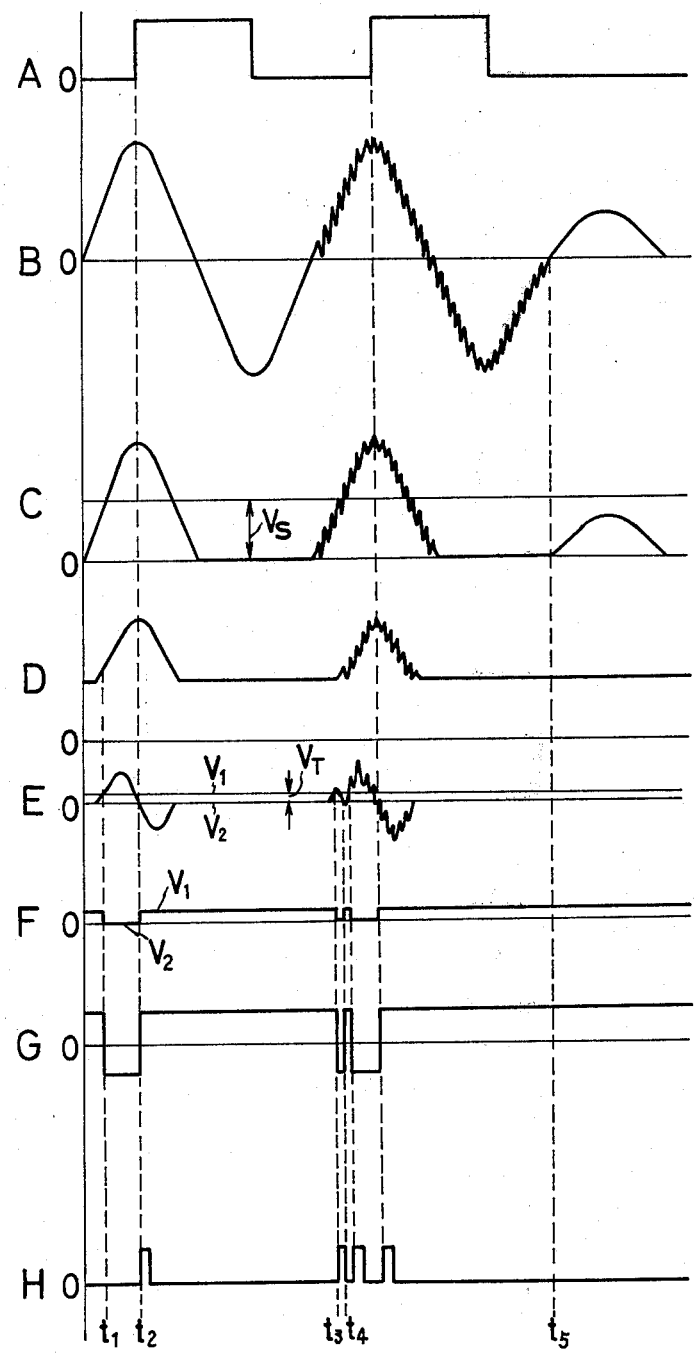
FIG. 2, consisting of 2A through 2H, is a representation of various waveforms useful in explaining the operation of the prior art peak sensing system of FIG. 1.

Graphically represented at A in FIG. 2 is an example of the waveform of the digital signal recorded on the magnetic tape 10. This digital signal is converted by the magnetic head 12 into an electric signal, which is subsequently amplified by the amplifier 14. The output from the amplifier 14 is shown at B in FIG. 2. This amplifier output undergoes half-wave rectification in the diode 16 and thus assumes the waveform shown at C in FIG. 2. The waveform at C in FIG. 2, however, is of explanatory nature, being plotted without regard to the presence of the slicer circuit 18.

If the boundary amplitude level value of the slicer circuit 18 is $V_S$, as indicated at C in FIG. 2 by way of example, then the output from the slicer circuit will have the waveform shown at D in FIG. 2. The slicer circuit 18 is intended to eliminate noise that may be contained in the output from the half-wave rectifying diode 16. Thus, any noise whose amplitude is less than the boundary amplitude level $V_S$, such as that originating at a moment $t_5$ in time, for example, is filtered out as it passes into the slicer circuit 18. Generally, the boundary amplitude level value of the slicer circuit 18 is determined in the range of from about 5 to 25 percent of the amplitude of the output from the amplifier 14 for usual signal reading operation in accordance with the prior art.

The slicer output shown at D in FIG. 2 is then fed into the differentiating circuit 24, the output from which is shown at E in FIG. 2. This differentiator output is fed into the operational amplifier 34 of the comparator circuit 32 via its inverting input terminal 48. When at a moment $t_1$ in time, the differentiator output voltage rises past the first or upper level $V_1$ of the reference voltage also being supplied to the operational amplifier 34 via its noninverting input terminal 50, the voltage at the output terminal 52 of the operational amplifier drops as shown at G in FIG. 2. This voltage at the operational amplifier output terminal 52 returns to the initial level when at a subsequent moment $t_2$ in time, the differentiator output voltage drops past the second or lower level $V_2$ of the reference voltage.

The moment $t_2$ at which the differentiator output voltage drops past the second reference voltage level $V_2$ substantially agrees with the moment at which the alternating output from the amplifier 14 (shown at B in FIG. 2) reaches its positive peak. As a consequence, the peaks of the output waveform from the magnetic head 12 can be ascertained from the output pulses of comparatively short durations (shown at H in FIG. 2) produced by the pulse trailing edge sensing circuit 42 in response to the trailing edges of the output pulses from the comparator circuit 32. In other words, the starting points of the digital signal on the magnetic tape 10 can thus be ascertained.

According to this prior art peak sensing system, the amplified and half-wave rectified output from the magnetic head 12 is made to pass through the slicer circuit 18 before being delivered to the differentiating circuit 24, so that the differentiator output shown at E in FIG. 2 has a relatively small amplitude. The differential $V_T$ between the first and the second reference voltage levels $V_1$ and $V_2$ (or the hysteresis of the comparator circuit 32) must therefore be minimized.

Thus, in event the output from the amplifier 14 has some high frequency noise superposed thereon, as represented by the second cycle of the alternating wave given at B in FIG. 2, then the output voltage from the differentiating circuit 24 may drop past the second reference voltage level $V_2$ at a moment $t_4$ in time immediately after rising past the first reference voltage level $V_1$ at a moment $t_3$ and may again rise past the first reference voltage level, as indicated at E in FIG. 2. The result is the "chattering" of the comparator circuit 32, with the subsequent pulse trailing edge sensing circuit 42 producing a rapid succession of pulses out of agreement with the peaks of the magnetic head output as shown at H in FIG. 2.

EMBODIMENT OF THE INVENTION

Figure 3:
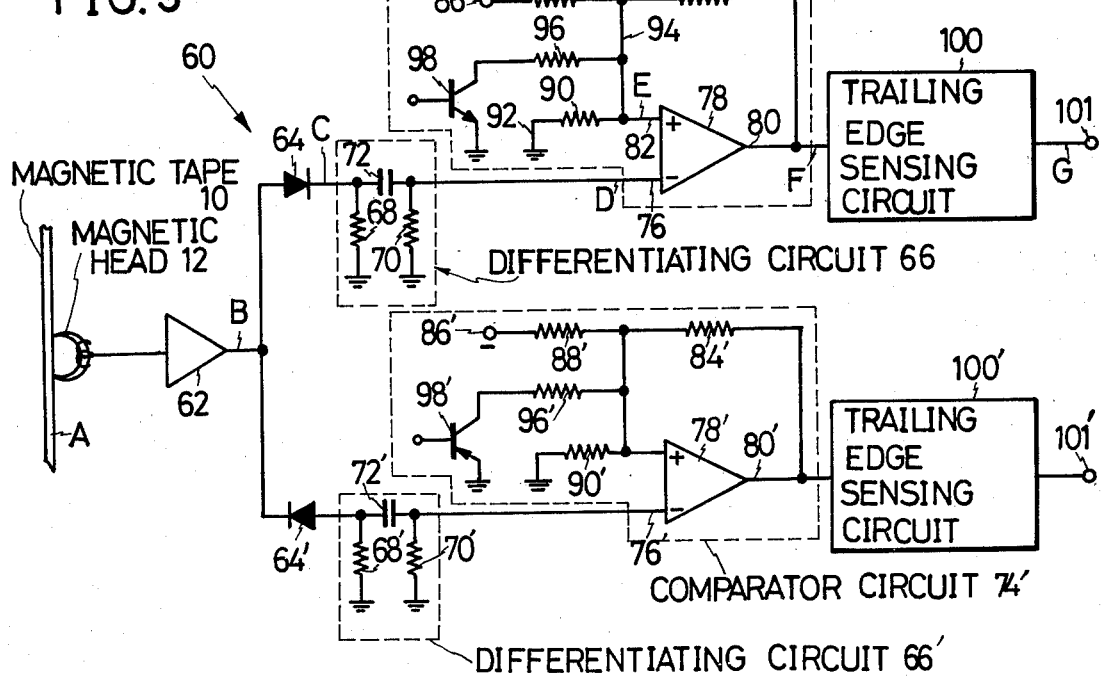
FIG. 3 is a schematic electrical diagram of the peak sensing system embodying the features of our invention.

The above described problem of the prior art is thoroughly overcome by our invention, which is described hereinbelow in terms of its first preferable embodiment. In FIG. 3 the peak sensing system according to our invention is shown adapted for sensing both positive and negative peaks of an output from a magnetic head and is therein generally designated 60. It will be seen that the peak sensing system is shown together with the magnetic tape 10 storing thereon a desired digital signal and traveling in sliding contact with the magnetic head 12.

The peak sensing system 60 according to our invention includes an amplifier 62 having its input connected to the magnetic head 12 for amplifying an output therefrom. The output of the amplifier 62 is connected to a pair of diodes 64 and 64' of opposite polarity each adapted to effect half-wave rectification of the amplified output from the magnetic head 12. The half-wave rectifying diodes 64 and 64' are connected directly to a pair of resistance-capacitance differentiating circuits 66 and 66', respectively, without interposition of slicers therebetween.

The pair of differentiating circuits 66 and 66' are of identical configuration. The differentiating circuit 66, for example, comprises two resistors 68 and 70 and a capacitor 72 which are connected as shown. Constituent elements of the other differentiating circuit 66' are indicated in FIG. 3 by priming the reference numerals used to designate the corresponding elements of the differentiating circuit 66.

The outputs of the differentiating circuits 66 and 66' are connected to the inputs of a pair of comparator circuits 74 and 74', or more specifically to the first or inverting input terminals 76 and 76' of a pair of operational amplifiers 78 and 78' constituting parts of the comparator circuits 74 and 74', respectively.

Connected between the output terminal 80 and the second or noninverting input terminal 82 of the operational amplifier 78 of the comparator circuit 74 is a resistor 84 which is intended to impart hysteresis to the operational amplifier. Another resistor 88 is connected between the second input terminal 82 of the operational amplifier 78 and a positive biasing terminal 86, and still another resistor 90 is connected between the second input terminal 82 of the operational amplifier and a line 92 grounded. Also included in the comparator circuit 74 are a switching transistor 98 of the NPN type and a further resistor 96 connected between this transistor and a line 94 connecting the second input terminal 82 of the operational amplifier to a point intermediate between the resistors 84 and 88.

The switching transistor 98 has its collector connected to the resistor 96 and its emitter grounded, so that this transistor is effective to selectively connect the resistor 96 in parallel with the resistor 90. The switching transistor 98 is intended to selectively vary the differential $V_T$ between the first and the second levels $V_1$ and $V_2$ (seen at D and E in FIG. 6) of the variable level-setting DC reference voltage delivered to the second input terminal 82 of the operational amplifier 78 from the biasing terminal 86 or, more precisely, to selectively vary the first or upper $V_1$ of the reference voltage.

As will be evident from FIG. 3, the reference voltage level differential $V_T$ is greater when the switching transistor 98 is nonconductive than when same is conductive. The greater reference voltage level differential is desirable as when the digital signal on the magnetic tape 10 is monitored substantially concurrently as the signal is recorded thereon, whereas the smaller reference voltage level differential may be preferred for usual signal reading operation, for reasons which will become apparent as the operation of the peak sensing system 60 is described later with reference to FIG. 6.

It will be seen from FIG. 3 that the other comparator circuit 74' is identical with the comparator circuit 74 described in the foregoing, except that a negative biasing terminal 86' is provided in lieu of the positive biasing terminal 86 and that a switching transistor 98' of the PNP type is provided in lieu of the NPN type transistor 98. The other constituent elements of the comparator circuit 74' are indicated in FIG. 3 simply by priming the reference numerals used to designate the corresponding elements of the comparator circuit 74.

The output terminals 80 and 80' of the operational amplifiers 78 and 78', or of the comparator circuits 74 and 74', are connected to a pair of pulse trailing edge sensing circuits 100 and 100', respectively, that are adapted to produce output pulses of comparatively short durations corresponding in time to the trailing edges of the output pulses from the comparator circuits. The reference numeral 101 indicates the output terminal of the positive peak sensing circuit of the system 60, and 101' the output terminal of the negative peak sensing circuit of the system.

Given below by way of example are some technical data pertinent to the peak sensing system 60 of FIG. 3:

Amplifier 62 . . . LM 301 manufactured by Texas Instruments, of the U.S.
Resistors 68 & 68' . . . 4.7 kilohms
Resistors 70 & 70' . . . 6.8 kilohms
Capacitors 72 & 72' . . . 4700 picofarads
Operational amplifiers 78 & 78' . . . LM 301 manufactured by Texas Instruments
Resistors 84 & 84' . . . 200 kilohms
Resistors 88 & 88' . . . 200 kilohms
Resistors 90 & 90' . . . 7 kilohms
Resistors 96 & 96' . . . 4 kilohms
Voltage at positive biasing terminal 86 . . . +12 volts
Voltage at negative biasing terminal 86' . . . −12 volts
Output voltages of comparator circuits 74 & 74' . . . ±12 volts As will be seen from the foregoing data, taken together with the circuit diagram of FIG. 3, the first reference voltage level $V_1$ of the comparator circuit 74 of this particular peak sensing system 60 is 0.78 volt when the transistor 98 is nonconductive, and 0.29 volt when the transistor 98 is conductive. The second reference voltage level $V_2$ of the comparator circuit 74 is substantially 0 volt regardless of the conduction or nonconduction of the switching transistor 98.

Similarly, the first reference voltage level $V_1$ of the other comparator circuit 74' of this particular peak sensing system 60 is −0.78 volt when the switching transistor 98' is nonconductive, and −0.29 volt when the transistor 98' is conductive. The second reference voltage level $V_2$ of the comparator circuit 74' is substantially 0 volt regardless of the conduction or nonconduction of the switching transistor 98'.

Further, provided that the digital signal on the magnetic tape 10 is monitored or read by this peak sensing system 60 immediately after, or substantially concurrently as, the signal is recorded thereon, the peak-to-peak amplitude of the alternating output from the amplifier 62 (seen at B in FIG. 6) is 20 volts; the amplitude of the positive output from the differentiating circuit 66 (seen at D in FIG. 6) is 2 volts; and the amplitude of the negative output from the other differentiating circuit 66' is −2 volts.

It is thus seen that in this particular peak sensing system 60, the differential $V_T$ between the first and the second reference voltage levels $V_1$ and $V_2$ of each comparator circuit 74, 74' is set at 39 percent of the normal output amplitude of the corresponding differentiating circuit 66, 66' (i.e., the amplitude of the output which will be produced by the differentiating circuit when the digital signal on the magnetic tape 10 is monitored or read immediately after, or subtantially concurrently as, the signal is recorded thereon) when the corresponding switching transistor 98, 98' is nonconductive, and at 14.5 percent of the normal output amplitude of the differentiating circuit when the switching transistor is conductive.

Generally speaking, however, the reference voltage level differential $V_T$ of each comparator circuit 74, 74' can be suitably determined anywhere in the range of from about 30 to about 50 percent of the normal output amplitude of the corresponding differentiating circuit 66, 66' when the corresponding switching transistor 98, 98' is nonconductive, and anywhere in the range of from about 5 to about 25 percent of the normal output amplitude of the differentiating circuit when the switching transistor is conductive.

It should be noted that in the peak sensing system 60 of FIG. 3, the pair of half-wave rectifying diodes 64 and 64' are connected directly to the respective differentiating circuits 66 and 66'. Thus, thanks to the absence of slicers from between the half-wave rectifying diodes 64 and 64' and the differentiating circuits 66 and 66', the reference voltage level differential $V_T$ of each of the comparator circuits 74 and 74' can be made sufficiently great to obviate the problem pointed out previously in connection with the prior art of FIG. 1, as will be described later in further detail with reference to the waveform diagrams of FIG. 6.

FIG. 4 illustrates in detail one possible configuration of the pulse trailing edge sensing circuit 100 used in the peak sensing system 60 of FIG. 3. The pulse trailing edge sensing circuit 100 has an input terminal 110 to which there is connected the output of the comparator circuit 74 of FIG. 3 and which is connected to one of the inputs of a NAND gate 112. Connected serially between the input terminal 110 and the other input of the NAND gate 112 are an amplifier 114, a delay circuit comprising resistor 116 and capacitor 118, and an schmitt circuit 120.

Supplied to the input terminal 110 of the pulse trailing edge sensing circuit 100 are the output pulses from the comparator circuit 74 of FIG. 3, with the comparator output pulses being graphically represented at A in FIG. 5. These comparator output pulses are supplied directly to the NAND gate 112 on the one hand and, on the other hand, to the delay circuit via the amplifier 114. The waveform shown at B in FIG. 5 is produced at the point B of the pulse trailing edge sensing circuit 100. It will be seen that the trailing edge of each pulse of the waveform B is slightly delayed in comparison with the trailing edge of the corresponding comparator output pulse. The waveform shown at B in FIG. 5 is then inverted and shaped by the schmitt circuit 120, into the waveform shown at C in FIG. 5, which is then supplied to the NAND gate 112.

The NAND gate 112, supplied as in the foregoing with the two inputs shown at A and C in FIG. 5, produces output pulses as shown at D in FIG. 5. As will be apparent from FIG. 5, for each comparator output pulse lasting from moment $t_1$ to moment $t_2$ in time, the NAND gate 112 produces a pulse of comparatively short duration originating at the moment $t_2$, so that the leading edge of each NAND gate output pulse corresponds in time to the trailing edge of one of the comparator output pulses, which in turn corresponds to one of the peaks of the output from the magnetic head.

Although not illustrated, the other pulse trailing edge sensing circuit 100' used in the peak sensing system 60 of FIG. 3 can be of identical configuration with the circuit 100 described above, except that the amplifier 114 of the circuit 100 is replaced by an inverter and that an additional inverter is connected between the input terminal 110 and the said one input of the NAND gate 112.

It is to be understood that the configuration of the pulse trailing edge sensing circuit is not limited to the one illustrated in FIG. 4 but is open to a variety of changes. For example, it may be composed of a resistance-capacitance differentiating circuit and a diode, without departing from the scope of our invention.

OPERATION

The operation of the peak sensing system 60 of FIG. 3 will now be described in detail with reference to the waveform diagrams of FIG. 6. The following description of operation, however, is limited to the positive peak sensing circuit of the system 60, it being understood that the negative peak sensing circuit of the system operates in an essentially identical manner.

Figure 6:
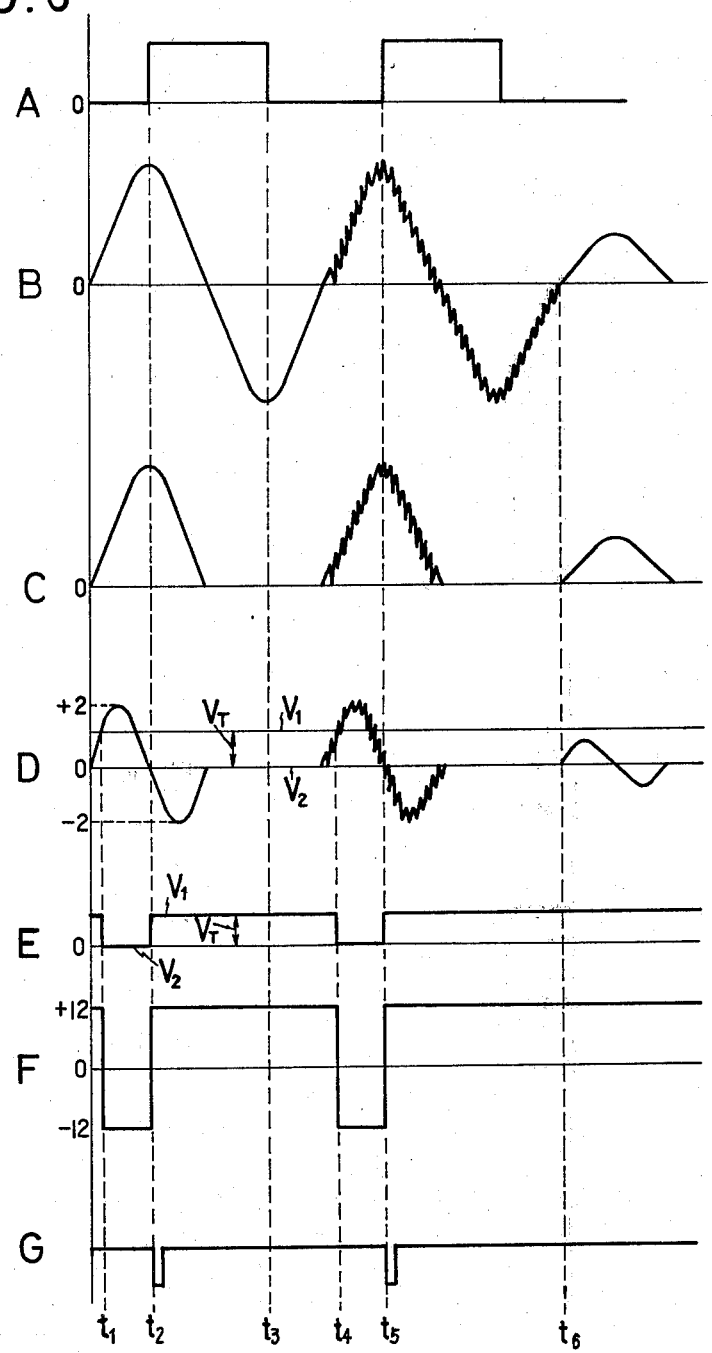
FIG. 6, consisting of 6A through 6G, is a representation of waveforms useful in explaining the operation of the peak sensing system of FIG. 3.

Shown at A in FIG. 6 is an example of the waveform of the digital signal recorded in the form of magnetic variations on the magnetic tape 10. As this magnetic tape travels in sliding contact with the magnetic head 12, the latter converts the magnetic variations on the tape into corresponding electric variations. The output thus produced by the magnetic head 12 is amplified by the amplifier 62. The amplified output from the magnetic head 12, shown at B in FIG. 6, is then fed into the half-wave rectifying diode 64, which permits the passage therethrough of only the positive half cycles of the alternating output from the amplifier 62. The output waveform from the half-wave rectifying diode 64 is shown at C in FIG. 6.

Without being sliced, the half-wave rectifier output is fed into the differentiating circuit 66. Thus, a low frequency noise which may be contained in the half-wave rectifier output, such as that originating at a moment $t_6$ in time, is also fed into the differentiating circuit 66 along with the desired half-wave rectifier output signal. The differentiating circuit 66 produces an output of relatively large amplitude, as shown at D in FIG. 6, which is supplied to the comparator circuit 74, that is, to the operational amplifier 78 via its first or inverting input terminal 76.

As will be seen from D in FIG. 6, the first or upper level of the variable reference voltage of the comparator circuit 74 is set lower than the peak value of the desired differentiator output but higher than the peak value of the low frequency noise originating at the moment $t_6$. It will also be noted that the differential $V_T$ between the first and the second levels $V_1$ and $V_2$ of the reference voltage is considerably more than the amplitude of the high frequency noise that is shown superposed on the second cycle of the alternating output from the amplifier 62.

When the increasing output voltage from the differentiating circuit 66 crosses the first reference voltage level $V_1$ at a moment $t_1$ in time, the output voltage from the operational amplifier 78 of the comparator circuit 74 drops from its first level of +12 volts to its second level of −12 volts, as shown at F in FIG. 6, and the reference voltage supplied to the operational amplifier via its second or noninverting input terminal 82 also drops to its second level of substantially 0 volt.

As a consequence, the output voltage from the comparator circuit 74 remains in its second level of −12 volts when the output voltage from the differentiating circuit 66 subsequently drops past the first reference voltage level $V_1$. The comparator output voltage returns to its first level of +12 volts only when, at a subsequent moment $t_2$ in time, the decreasing output voltage from the differentiating circuit 66 crosses the second reference voltage level of substantially 0 volt.

The comparator output pulses thus obtained, shown at F in FIG. 6, are then fed into the pulse trailing edge sensing circuit 100. This circuit 100 produces, in the manner previously explained in connection with FIGS. 4 and 5, output pulses of comparatively short durations shown at G in FIG. 6. The leading edges of these short duration pulses correspond in time to the trailing edges of the comparator output pulses and to the peaks of the output from the magnetic head 12. In practice, however, there will be a slight time lag between each peak of the magnetic head output and the leading edge of the corresponding output pulse from the pulse trailing edge sensing circuit 100.

As previously mentioned, the differential $V_T$ between the first and the second reference voltage levels $V_1$ and $V_2$ of the comparator circuit 74 is practically maximized according to our invention, particularly when the switching transistor 98 is nonconductive. Consequently, even though the differentiating circuit 66 may deliver a low frequency noise, such as that originating at the moment $t_6$ in FIG. 6, to the comparator circuit 74, the latter will produce no corresponding output pulse because the peak value of the low frequency noise is less than the first reference voltage level $V_1$.

Furthermore, since the reference voltage level differential $V_T$ is considerably greater than the amplitude of the high frequency noise shown superposed on the second cycle of the alternating output from the amplifier 62 in FIG. 6, also as previously mentioned, the comparator circuit 74 will not respond to such high frequency noise but will produce a correct output pulse lasting from moment $t_4$ to moment $t_5$ as shown at F in FIG. 6. The peaks of the output from the magnetic head 12 can therefore be highly accurately sensed or located in accordance with our invention.

The amplitude of the output from the magnetic head 12 will decrease when the digital signal on the magnetic tape 10 is read after its magnetization level has lessened with the lapse of time or for other reasons. Since then the amplitude of the output from the differentiating circuit 66 also decreases correspondingly, the switching transistor 98 may be rendered conductive by suitable means for changing the reference voltage level differential $V_T$ to the smaller value in the range of from about 5 to about 25 percent of the normal output amplitude of the differentiating circuit.

It will be apparent that the negative peak sensing circuit of FIG. 3 operates in a manner similar to the above described operation of the positive peak sensing circuit, producing output pulses as at a moment $t_3$ in FIG. 6 to indicate each negative peak of the magnetic head output.

MODIFICATION

FIG. 7 illustrates a slight modification of the preceding embodiment. Most parts of the modified peak sensing system, generally designated 60a, have corresponding parts in the system 60 of FIG. 3, so that they will be identified by the same reference numerals as those used to designate the corresponding parts of the system 60, and their description will be omitted.

The modified peak sensing system 60a is perhaps best characterized by a differentiating circuit 130 which comprises a serial connection of resistor 132 and capacitor 134 and which is connected in parallel with the resistor 84 of the comparator circuit 74. Further, those extremities of the resistors 68 and 70 of the differentiating circuit 66 which are connected to ground in the system 60 of FIG. 3 are connected in common to a 2.5-volt supply terminal 136. One of the extremities of the resistor 90 and the emitter of the switching transistor 98 are also connected in common to a 2.5-volt supply terminal 138, instead of being grounded. A supply voltage of 5 volts, instead of 12 volts, is supplied through the terminal 86. The first or upper output voltage level of the operational amplifier 78 or of the comparator circuit 74 is 5 volts, and its second or lower output voltage level is 0 volt.

In the peak sensing system 60a of the foregoing configuration, the amplifier 62 connected to the magnetic head 12 produces an output which alternates about the mean value of 2.5 volts as shown at A in FIG. 8. Only the higher half cycles of this alternating output are permitted to pass through the half-wave rectifying diode 64, so that the pulsating DC output from this diode, shown at B in FIG. 8, has a voltage of 2.5 volts at the lowest. Supplied with this half-wave rectifier output, the differentiating circuit 66 produces an output varying about the mean value of 2.5 volts as shown at C in FIG. 8.

The differentiator output of FIG. 8C is supplied to the comparator circuit 74 and is therein compared with the first level $V_1$ of its variable reference voltage. When the increasing differentiator output voltage crosses the first reference voltage level $V_1$ at a moment $t_1$ in time, the output voltage from the operational amplifier 78, or from the comparator circuit 74, drops from its first level of 5 volts to its second level of 0 volt, as shown at D in FIG. 8. The reference voltage of the comparator circuit 74 also changes from its first level $V_1$ to its second level $V_2$.

It should be noted that the above change of the reference voltage from its first to its second level does not take place instantly but in the manner shown at E in FIG. 8 owing to the presence of the differentiating circuit 130 connected in parallel with the resistor 84 of the comparator circuit 74. Thus, each time the comparator circuit 74 produces an output pulse, the reference voltage level differential $V_T$ temporarily increases to such a degree that there is little or no likelihood of the comparator circuit unnecessarily responding to a high frequency noise which may be superposed on the output from the differentiating circuit 66.

When the decreasing output voltage from the differentiating circuit 66 subsequently crosses the second reference voltage level $V_2$, which is approximately 2.5 volts, at a moment $t_2$ in time, the output voltage from the comparator circuit 74 returns from its second level of 0 volt to its first level of 5 volts. This moment $t_2$ substantially agrees with the moment at which the alternating output from the amplifier 62 reaches its positive peak, so that the successive peaks of the output from the magnetic head 12 can be ascertained as the pulse trailing edge sensing circuit 100 produces the pulses of comparatively short durations corresponding to the trailing edges of the comparator output pulses.

The above described embodiments are merely illustrative of the principles of our invention. It will be apparent, for example, that the peak sensing system 60 of FIG. 3 can be modified to sense either positive or negative peaks only of the output from the magnetic head, without prejudicing the novelty of the invention. The system 60a of FIG. 7 can also be easily modified to sense the negative peaks of the magnetic head output. It is further understood that numerous variations and modifications in the above described systems and in the components thereof will be readily apparent to those skilled in the art without departing from the spirit and scope of our invention as expressed in the appended claims.

We claim:

1. A system for sensing the peaks of an output produced by a magnetic head as the latter converts magnetic variations on a magnetic recording medium into electric variations, comprising in combination:
    amplifier means for amplifying the output from said magnetic head;
    half-wave rectifier means for effecting half-wave rectification of an output from said amplifier means;
    differentiating circuit means connected directly to said half-wave rectifier means for differentiating an output therefrom;
    comparator means for comparing an output from said differentiating circuit means with a reference voltage having first and second levels and for producing an output voltage having third and fourth levels, said output voltage from said comparator means changing from said third to said fourth level when the output from said differentiating circuit means crosses said first level of said reference voltage and changing from said fourth to said third level when the output from said differentiating circuit means subsequently crosses said second level of said reference voltage, said first and said second levels of said reference voltage having a sufficiently great differential therebetween to prevent said comparator means from responding to noise which may be contained in the output from said differentiating circuit means; and
    means connected to said comparator means for sensing the trailing edges of output pulses produced thereby.

2. A peak sensing system as set forth in claim 1, wherein said comparator means includes means for selectively varying the differential between said first and said second levels of said reference voltage.

3. A peak sensing system as set forth in claim 2, wherein said comparator means comprises:
    an operational amplifier having a first input terminal for receiving the output from said differentiating circuit means, a second input terminal, and an output terminal;
    a first resistor connected between said output terminal and said second input terminal of said operational amplifier;
    a supply terminal;
    a second resistor connected between said supply terminal and said second input terminal of said operational amplifier; and
    a third resistor connected between said second input terminal of said operational amplifier and a line having a potential substantially equal to said second level of said reference voltage; and
    wherein said selectively varying means comprises:
    a fourth resistor; and
    switching means for selectively connecting said fourth resistor in parallel with said third resistor;
    whereby the differential between said first and said second levels of said reference voltage can be selectively changed to either of two different predetermined values.

4. A peak sensing system as set forth in claim 3, wherein one of said two predetermined values of the reference voltage level differential is in the range of from about 30 to about 50 percent of the normal amplitude of the output from said differentiating circuit means, and wherein the other of said two predetermined values of the reference voltage level differential is in the range of from about 5 to about 25 percent of the normal amplitude of the output from said differentiating circuit means.

5. A peak sensing system as set forth in claim 3, wherein said switching means is a transistor.

6. A peak sensing system as set forth in claim 1, wherein said comparator means comprises:
    an operational amplifier having a first input terminal for receiving the output from said differentiating circuit means, a second input terminal, and an output terminal;
    a first resistor connected between said output terminal and said second input terminal of said operational amplifier;
    second differentiating circuit means connected in parallel with said first resistor;
    a supply terminal;
    a second resistor connected between said supply terminal and said second input terminal of said operational amplifier; and
    a third resistor connected between said second input terminal of said operational amplifier and a line having a potential substantially equal to said second level of said reference voltage.

* * * * *